United States Patent
Ha

(10) Patent No.: US 9,916,894 B2
(45) Date of Patent: Mar. 13, 2018

(54) RESISTANCE CHANGE MEMORY DEVICE AND METHOD OF SENSING THE SAME

(71) Applicant: SK hynix Inc., Icheon (KR)

(72) Inventor: Tae Jung Ha, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/435,158

(22) Filed: Feb. 16, 2017

(65) Prior Publication Data

US 2017/0372778 A1   Dec. 28, 2017

(30) Foreign Application Priority Data

Jun. 27, 2016   (KR) .................. 10-2016-0080444

(51) Int. Cl.
*G11C 11/16*   (2006.01)
*G11C 13/00*   (2006.01)

(52) U.S. Cl.
CPC ............ *G11C 13/004* (2013.01); *G11C 11/16* (2013.01); *G11C 13/0004* (2013.01); *G11C 13/0097* (2013.01)

(58) Field of Classification Search
CPC .............................. G11C 13/0069; G11C 11/16
USPC .................................................. 365/148, 158
See application file for complete search history.

(56) References Cited

U.S. PATENT DOCUMENTS

| | | | |
|---|---|---|---|
| 6,707,713 B1 * | 3/2004 | Parker ................. | G11C 11/5642 365/185.03 |
| 2011/0122677 A1 * | 5/2011 | Ozeki ................. | G11C 11/5642 365/148 |
| 2011/0123022 A1 * | 5/2011 | Oishi ................. | G06F 7/588 380/46 |
| 2013/0088909 A1 * | 4/2013 | Liu ..................... | G11C 13/0038 365/148 |
| 2013/0322156 A1 | 12/2013 | Papandreou et al. | |
| 2014/0286077 A1 * | 9/2014 | Hatsuda ................. | G11C 11/16 365/148 |
| 2014/0321191 A1 * | 10/2014 | Bedeschi ............. | G11C 13/004 365/148 |
| 2015/0023100 A1 * | 1/2015 | Huynh .................. | G11C 16/12 365/185.05 |
| 2015/0228351 A1 * | 8/2015 | Wang .................... | G11C 16/26 365/185.21 |

(Continued)

FOREIGN PATENT DOCUMENTS

KR   10-2015-0099090 A   8/2015

*Primary Examiner* — Michael Tran

(57) ABSTRACT

A method of sensing a resistance change memory device includes preparing a memory cell including a variable resistance element storing different data on the basis of a variable resistance, and a switching element connected to the variable resistance element and performing a threshold switching operation, measuring a first cell current by applying a first read voltage to the memory cell, the first read voltage being selected in a threshold-sensing range of a current-voltage characteristic curve of the memory cell, measuring a second cell current by applying a second read voltage to the memory cell, the second read voltage being selected in a resistance-sensing range of the current-voltage characteristic curve, and when at least one of the first cell current and the second cell current is greater than a corresponding reference current, outputting a data signal having a first logic value as data stored in the memory cell.

15 Claims, 10 Drawing Sheets

(56) References Cited

U.S. PATENT DOCUMENTS

| | | | |
|---|---|---|---|
| 2015/0262661 A1* | 9/2015 | Chu | G11C 11/5678 |
| | | | 365/163 |
| 2015/0268264 A1* | 9/2015 | Nelson | G01K 7/22 |
| | | | 73/204.25 |
| 2016/0217852 A1* | 7/2016 | Wu | G11C 13/004 |
| 2017/0213590 A1* | 7/2017 | Muralimanohar | G11C 13/004 |
| 2017/0307764 A1* | 10/2017 | Iizuka | H01L 27/146 |

* cited by examiner

RESISTANCE CHANGE MEMORY DEVICE AND METHOD OF SENSING THE SAME

CROSS-REFERENCE TO RELATED APPLICATION

The present application claims priority under 35 U.S.C 119(a) to Korean Patent Application No. 10-2016-0080444, filed on Jun. 27, 2016, which is herein incorporated by reference in its entirety.

BACKGROUND

1. Technical Field

Various embodiments of the present disclosure generally relate to a semiconductor memory device, and more particularly, to a resistance change memory device and a method of sensing the same.

2. Related Art

In general, a resistance change memory device refers to a device in which different data is stored according to different resistance states induced by a resistance variation of a nonvolatile memory material layer disposed in each unit cell. The resistance change memory device may be collectively referred to a resistive random access memory device (RRAM), a phase change random access memory device (PRAM), a magnetic random access memory device (MRAM), or the like.

Recently, three-dimensional cell structures, such as cross-point memory array structures, have been proposed to highly integrate the above-described resistance change memory device. For example, a cross-point memory array structure may include pillar shaped unit cells disposed between electrodes on different planes that intersect each other.

SUMMARY

Various embodiments are directed to a method of sensing a resistance change memory device, which can more reliably read out data in a memory cell, and a resistance change memory device performing the sensing method.

According to an embodiment, there is provided a method of sensing a resistance change memory device. The method includes preparing a memory cell including a variable resistance element configured to store different data on the basis of a variable resistance, and a switching element connected to the variable resistance element and configured to perform a threshold switching operation, measuring a first cell current by applying a first read voltage to the memory cell, the first read voltage being selected in a threshold-sensing range of a current-voltage characteristic curve of the memory cell, measuring a second cell current by applying a second read voltage to the memory cell, the second read voltage being selected in a resistancesensing range of the current-voltage characteristic curve, and when at least one of the first cell current and the second cell current is greater than a corresponding reference current, outputting a data signal having a first logic value as data stored in the memory cell.

According to another embodiment, there is provided a method of sensing a resistance change memory device. The method includes preparing a memory cell including a variable resistance element configured to store different data on the basis of a variable resistance, and a switching element connected to the variable resistance element and configured to perform a threshold switching operation, obtaining a current-voltage characteristic curve for the memory cell, determining a first read voltage within a first threshold-sensing range of the current-voltage characteristic curve and a second read voltage within a resistance sensing range of the current-voltage characteristic curve, performing at least one of a first read operation including applying the first read voltage to the memory cell and a second read operation including applying the second read voltage to the memory cell, and determining a data is value in the memory cell on the basis of at least one result of the first read operation and the second read operation.

According to another embodiment, there is provided a resistance change memory device. The resistance change memory device includes a memory cell including a variable resistance element configured to store different data on the basis of a variable resistance value, and a switching element connected to the variable resistance element and configured to perform a threshold switching operation, and a sense amplifier configured to perform a read operation on the memory cell including reading a data value stored in the variable resistance element. The read operation is performed by applying a first read voltage and a second read voltage to the memory cell, the first read voltage being selected in a threshold-sensing range of the memory cell, and the second read voltage being selected in a resistance-sensing range of the memory cell.

BRIEF DESCRIPTION OF THE DRAWINGS

Various embodiments of the disclosure will become more apparent in view of the attached drawings and accompanying detailed description, in which.

DETAILED DESCRIPTION OF THE EMBODIMENTS

Figure 1:
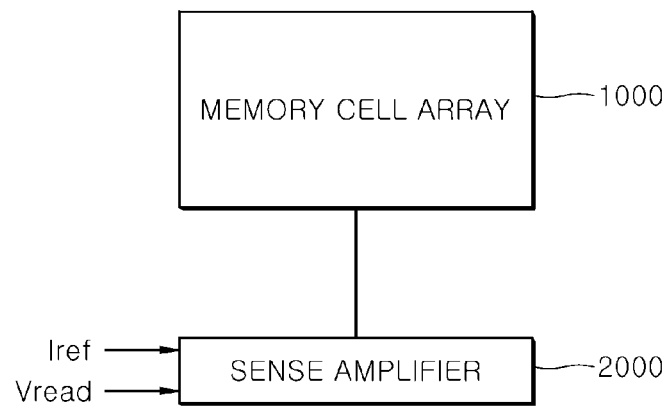
FIG. 1 is block diagram illustrating a resistance change memory device according to an embodiment of the present disclosure.

Various embodiments will now be described hereinafter with reference to the accompanying drawings. In the drawings, the dimensions of layers and regions may be exaggerated for clarity of illustration. The drawings are described in the observer's viewpoint overall, therefore, expressions of "upper" or "lower" described herein may also be interpreted as "bottom" or "upper" in accordance with a change of the observer's viewpoint. If an element is referred to be located "on" another element, it may be understood that the element is directly located on the other element, or an additional element may be interposed between the element and the other element. The same reference numerals refer to the same elements throughout the specification.

In addition, expression of the singular form should be understood to include the plural forms unless clearly used otherwise in context. It will be understood that the terms "comprise" or "have" are intended to specify the presence of a feature, a number, a step, an operation, an element, a part or combinations thereof, but not used to preclude the presence or possibility of addition one or more other features, numbers, steps, operations, components, parts or combinations thereof.

A switching device described herein may perform a threshold switching operation by sequentially implementing a turned-on state or a turned-off state when an external voltage, which has a varying absolute value, is applied to the switching device. After the threshold switching operation, when the external voltage is removed, an operation current, except for a leakage current, may be blocked from the switching device. That is, a leakage current may flow through the switching device after the threshold switching operation, but an operation current may not flow through the switching device after the threshold switching operation.

A variable resistance device described herein may be understood as a device having a low resistive state or a high resistive state, depending on a value or polarity of the externally applied voltage. The device may store a nonvolatile logic data value as the resistive state.

FIG. 1 is block diagram illustrating a resistance change memory device according to an embodiment of the present disclosure. Referring to FIG. 1, the resistance change memory device 1 may include a memory cell array 1000 and a sense amplifier 2000.

The memory cell array 1000 may include a plurality of nonvolatile memory cells. The sense amplifier 2000 may sense data programmed in a selected memory cell, amplify the sensed data, and change the amplified data into a binary logic value. In addition, the sense amplifier 2000 may output the binary logic value to a buffer of a next stage.

The sense amplifier 2000 may receive a read voltage $V_{read}$ and a reference current $I_{ref}$ from an outside source. The sense amplifier 2000 may apply the received read voltage $V_{read}$ to the memory cell array 1000. The sense amplifier 2000 may measure a current generated in the selected memory cell in response to the read voltage $V_{read}$, compare the measured current with the reference current $I_{ref}$, and output a logic value of data stored in the selected memory cell based on the comparison.

Figure 2:
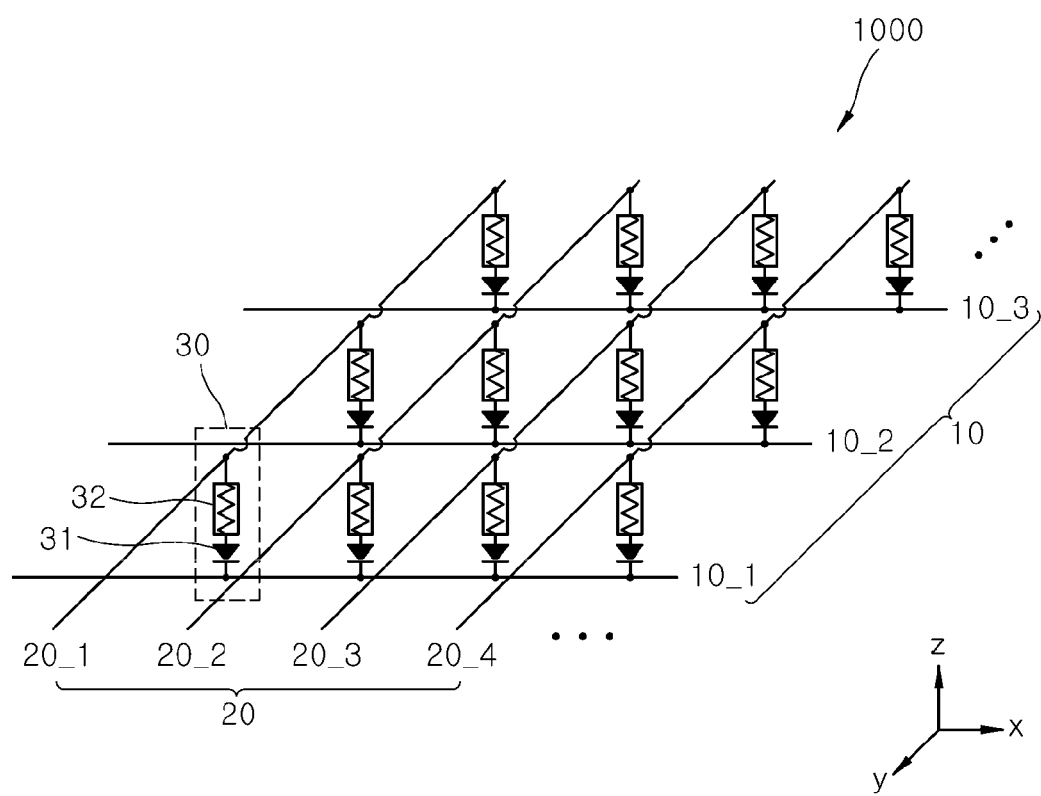
FIG. 2 is a view illustrating a memory cell array according to an embodiment of the present disclosure.

FIG. 2 is a view illustrating a memory cell array according to an embodiment of the present disclosure. Referring to FIG. 2, the memory cell array 1000 may have a cross-point memory array structure. More specifically, the memory cell array 1000 may include first conductive lines 10 extending in a first direction, for example, an x-direction, and second conductive lines 20 extending in a second direction, for example, a y-direction, which is not parallel to the first direction.

The first conductive lines 10 and the second conductive lines 20 may be comprised of a plurality of first lines 10_1, 10_2, 10_3, . . . and a plurality of second lines 20_1, 20_2, 20_3, 20_4, . . . , respectively. The first conductive lines 10 and the second conductive lines 20 are arranged on different planes. A plurality of memory cells 30 may be disposed at regions where the plurality of first lines 10_1, 10_2, 10_3, . . . and the plurality of second lines 20_1, 20_2, 20_3, 20_4, . . . intersect each other.

Each of the memory cells 30 may include a switching element 31 and a variable resistance element 32 that are electrically connected to each other in series. The switching element 31 may perform a threshold switching operation in response to a read voltage applied from an outside source during a read operation for the memory cells 30. A read operation error caused by a leakage current generated between adjacent memory cells 30 can be prevented by the switching element 31. The switching element 31 may include, for example, a transistor, a diode, a tunnel barrier element, an ovonic threshold switch, a metal-insulator-metal switch, or the like.

The variable resistance element 32 may include a resistance change material layer, and may store different logic signals that change depending on a resistance variation of the resistance change material layer. The logic signals may be nonvolatile values. The variable resistance element 32 may be employed in a resistive RAM device, a phase change RAM device, or a magnetic RAM device.

Figure 3:
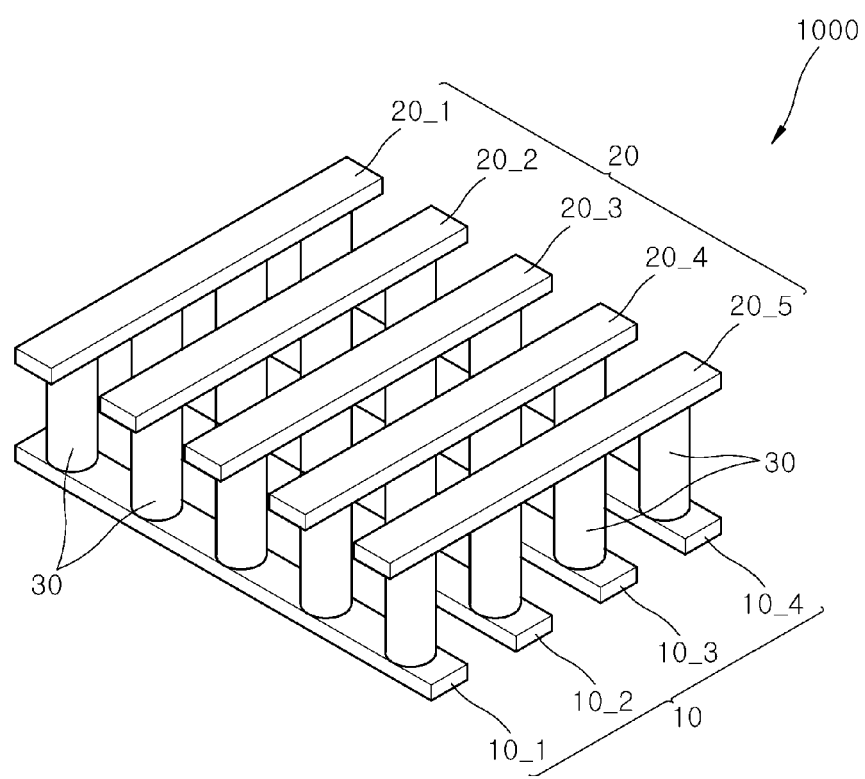
FIG. 3 is a perspective view illustrating a structure of a memory cell array according to an embodiment of the present disclosure.
Figure 4:
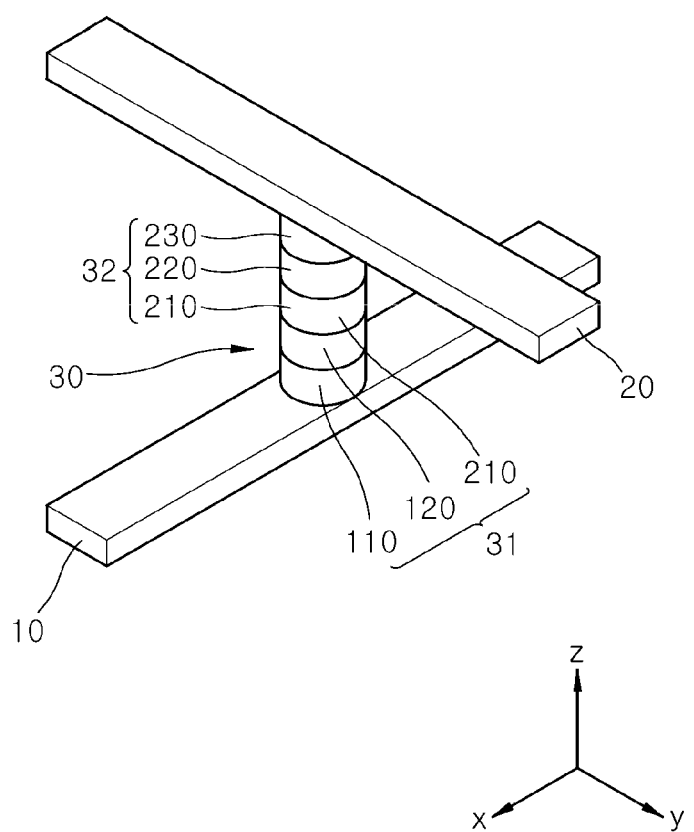
FIG. 4 is a perspective view illustrating a memory cell of the memory cell array illustrated in FIG. 3 according to an embodiment of the present disclosure.

FIG. 3 is a perspective view illustrating a structure of a memory cell array according to an embodiment of the present disclosure. FIG. 4 is a perspective view illustrating a memory cell of the memory cell array illustrated in FIG. 3 according to an embodiment of the present disclosure.

Referring to FIGS. 3 and 4, a memory cell may include a variable resistance element of a resistive RAM device and a switching element of a metal-insulator-metal structure. However, embodiments are not limited thereto. Any of the above-described kinds of resistance change memory devices and switching devices may be optionally employed.

Referring to FIG. 3, the memory cell array 10 may include first conductive lines 10 extending in an x-direction, second conductive lines 20 extending in a y-direction, and memory cells 30 of pillar-shaped structures disposed at overlap regions between the first and second conductive lines 10 and 20 and extending in a z-direction. The memory cells 30 may be two-dimensionally arranged along the x-direction and the y-direction.

Although a rectangular coordinate system is illustrated in FIG. 3, embodiments are not limited to the rectangular coordinate system. For example, in some other embodiments, any one of various non-rectangular coordinate systems may be used. In such a case, the x-direction and the y-direction may intersect each other at a non-right angle.

Referring to FIG. 4, each of the memory cells 30 may include a lower electrode 110, an insulation layer 120, a middle electrode 210, a resistive memory layer 220, and an upper electrode 230. The lower electrode 110, the insulation layer 120, and the middle electrode 210 may constitute a switching element 31. The middle electrode 210, the resistive memory layer 220, and the upper electrode 230 may constitute a variable resistance element 32. The switching element 31 and the variable resistance element 32 may share the middle electrode 210.

In each of the memory cells 30, each of the lower electrode 110, the middle electrode 210, and the upper electrode 230 may include a metal material, a conductive nitride material, a conductive oxide material, or the like. In an embodiment, each of the lower electrode 110, the middle electrode 210, and the upper electrode 230 may include gold (Au), aluminum (Al), platinum (Pt), copper (Cu), silver (Ag), ruthenium (Ru), titanium (Ti), iridium (Ir), tungsten (W), titanium nitride (TiN), tantalum nitride (TaN), ruthenium oxide ($RuO_2$), or the like.

In the switching element 31, the insulation layer 120 may include a silicon oxide material, a silicon nitride material, a metal oxide material, a metal nitride material, or a combination thereof. In an embodiment, the insulation layer 120 may include any of an aluminum oxide material, a zirconium oxide material, a hafnium oxide material, a tungsten oxide material, a titanium oxide material, a nickel oxide material, a copper oxide material, a manganese oxide material, a tantalum oxide material, a niobium oxide material, and an iron oxide material. The insulation layer 120 may include a compound material having a composition that does not satisfy a stoichiometric ratio. The insulation layer 120 may have an amorphous structure.

Trap sites, which can capture conductive carriers, may be distributed in the insulation layer 120. The trap sites may be generated by dopants that are injected into the insulation layer 120.

When a voltage that is externally applied to the switching element 31 is increased above a predetermined threshold voltage, conductive carriers captured by the trap sites may move along an electric field formed by the externally applied voltage. Accordingly, the switching element 31 may be turned on. On the other hand, when the externally applied voltage is decreased below the predetermined threshold voltage, the conductive carriers may be trapped by the trap sites and conduction by the conductive carriers may be suppressed. When the conduction of the conductive carriers is suppressed, the switching element 31 may be turned off.

A variety of materials that generate an energy level which can accommodate the conductive carriers in the insulation layer 120 may be employed as the dopants in the insulation layer 120. In an embodiment, if the insulation layer 120 includes a silicon oxide material or a silicon nitride material, the dopants may include at least one of aluminum (Al), lanthanum (La), niobium (Nb), vanadium (V), tantalum (Ta), tungsten (W), chrome (Cr), molybdenum (Mo), boron (B), nitrogen (N), carbon (C), phosphorus (P), and arsenic (As). In another embodiment, if the insulation layer 120 includes an aluminum oxide material or an aluminum nitride material, the dopants may include at least one of titanium (Ti), copper (Cu), zirconium (Zr), hafnium (Hf), niobium (Nb), vanadium (V), tantalum (Ta), tungsten (W), chrome (Cr), molybdenum (Mo), boron (B), nitrogen (N), carbon (C), phosphorus (P), and arsenic (As).

In the variable resistance element 32, the resistive memory layer 220 may include a material that has either a high resistive state or a low resistive state according to the externally applied voltage. In an embodiment, the resistive memory layer 220 may include a metal oxide material such as a titanium oxide material, an aluminum oxide material, a nickel oxide material, a copper oxide material, a zirconium oxide material, a manganese oxide material, a hafnium oxide material, a tungsten oxide material, a tantalum oxide material, a niobium oxide material, or an iron oxide material.

In another embodiment, the resistive memory layer 220 may include a perovskite material such as a praseodymium calcium manganese oxide ($Pr_{0.7}Ca_{0.3}MnO_3$) material, a $La_{1-x}Ca_xMnO_3$ (LCMO) material, a $Ba_{0.5}Sr_{0.5}Co_{0.8}Fe_{0.2}O_{3-\delta}$ (BSCFO) material, a $YBa_2Cu_3O_{7-x}$ (YBCO) material, a $(Ba,Sr)TiO_3$(Cr,Nb-doped) material, a $SrZrO_3$(Cr,V-doped) material, a (La,Sr)$MnO_3$ material, a $Sr_{1-x}La_xTiO_3$ material, a $La_{1-x}Sr_xFeO_3$ material, a $La_{1-x}Sr_xCoO_3$ material, a $SrFeO_{2.7}$ material, a $LaCoO_3$ material, a $RuSr_2GdCu_2O_3$ material, or a $YBa_2Cu_3O_7$ material.

In yet another embodiment, the resistive memory layer 220 may include a selenide material, such as a $Ge_xSe_{1-x}$(Ag, Cu,Te-doped) material, or a metal sulfide material, such as an $Ag_2S$ material, a $Cu_2S$ material, a CdS material, or a ZnS material.

Figure 5:
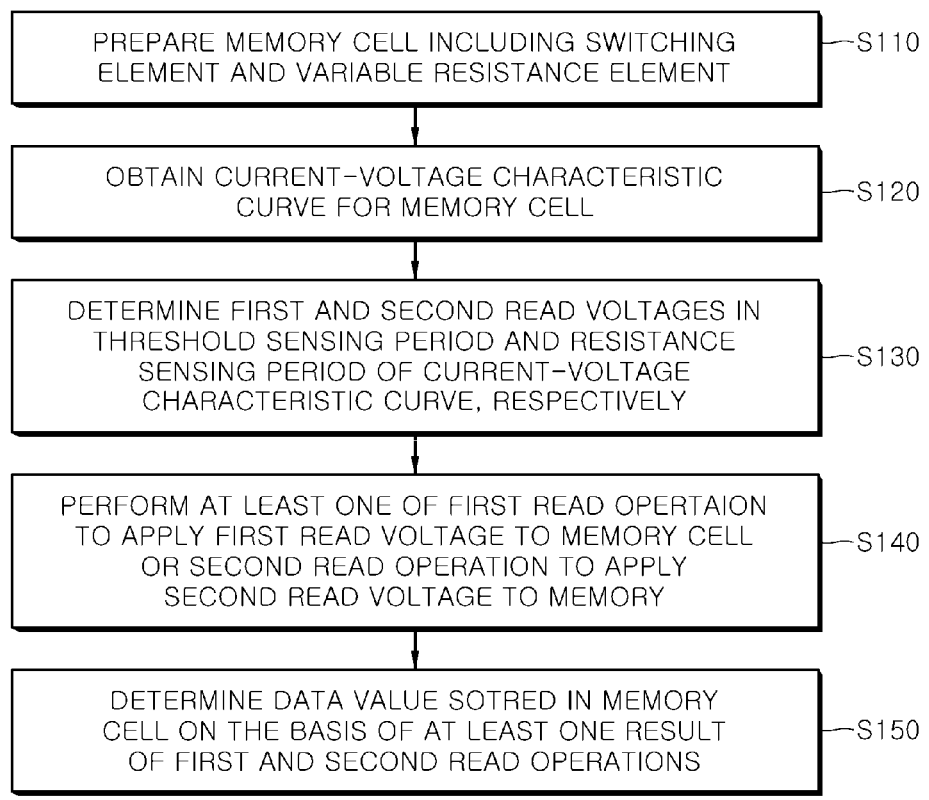
FIG. 5 is a flow chart illustrating a sensing method of a resistance change memory device according to an embodiment of the present disclosure.
Figure 6:
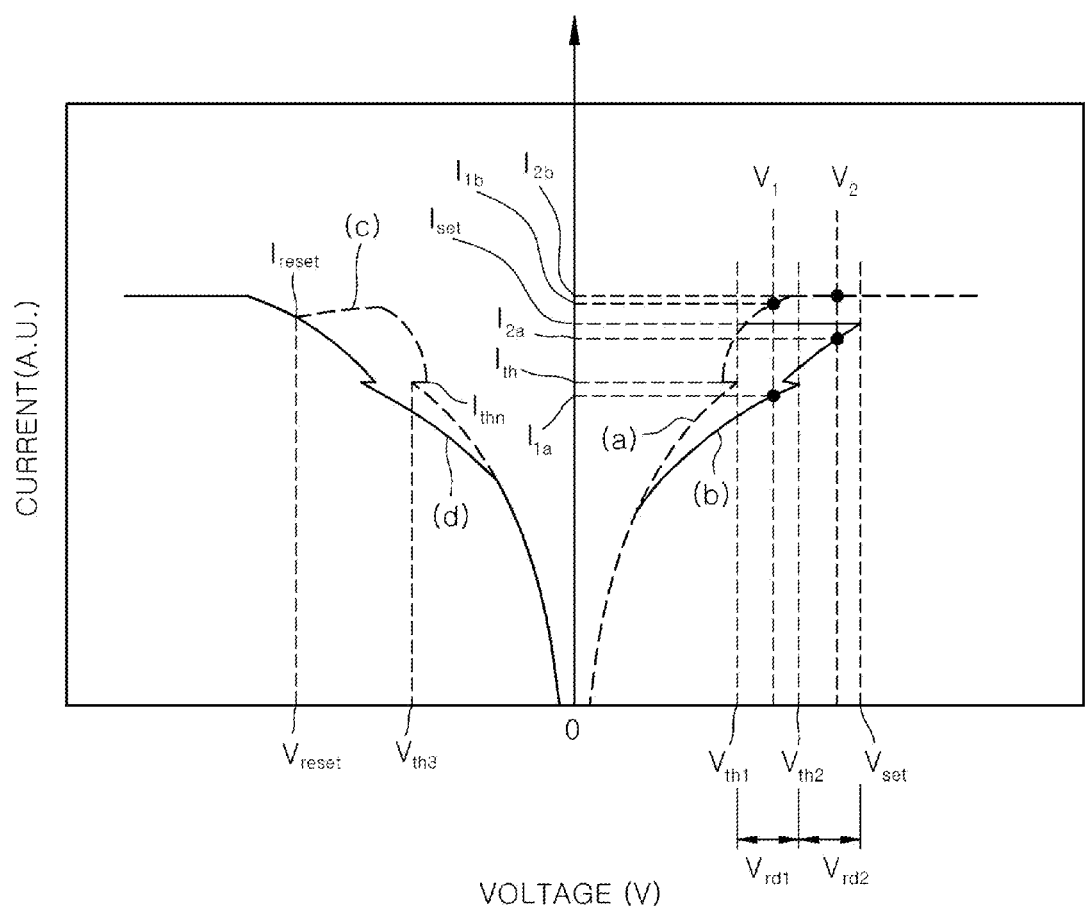
FIG. 6 illustrates a current-voltage characteristic curve of a memory cell of a resistance change memory device according to an embodiment of the present disclosure.

FIG. 5 is a flow chart illustrating a sensing method of a resistance change memory device according to an embodiment of the present disclosure. FIG. 6 is a graph illustrating a current-voltage characteristic curve of a memory cell of a resistance change memory device according to an embodiment of the present disclosure. Hereinafter, the sensing method of the present embodiment will be described using the resistance change memory device 1 described with reference to FIGS. 1 to 4.

Referring to FIG. 5, in operation S110, a memory cell 30 including a switching element 31 and a variable resistance element 32 is prepared. In an embodiment, the memory cell 30 may be formed in a memory cell array 1000 having a cross-point memory structure.

The switching element 31 may be connected to the variable resistance element 32, and may perform a threshold switching operation. The variable resistance element 32 may store different data by having different variable resistance values. In an embodiment, the switching element 31 and the variable resistance element 32 may be electrically connected to each other in series.

Referring to FIGS. 5 and 6, in operation S120, a current-voltage characteristic curve for the memory cell 30 may be obtained. The current-voltage characteristic curve may be obtained using a current sweep method or a voltage sweep method. In the current sweep method, a voltage of the memory cell 30 is measured after applying a current to the memory cell 30. In the voltage sweep method, a current of the memory cell 30 is measured after applying a voltage to the memory cell 30.

In an embodiment, the current sweep method may include any of a positive current sweep method and a negative current sweep method. In the positive current sweep method, a current applied to the memory cell 30 may be gradually increased from 0 A in a positive direction and then gradually decreased back to 0 A.

That is, the current applied to the memory cell 30 may sweep from 0 A to a predetermined positive current, and then sweep down to 0 A from the predetermined positive current. In the negative current sweep method, an absolute value of the current applied to the memory cell 30 may be gradually increased from 0 A in a negative direction and then gradually decreased back to 0 A. That is, the current applied to the memory cell 30 may sweep from 0 A down to a predetermined negative current, and then sweep up to 0 A from the predetermined negative current.

In an embodiment, the voltage sweep method includes any of a positive voltage sweep method and a negative voltage sweep method. In the positive voltage sweep method, a voltage applied to the memory cell 30 may be gradually increased from 0 V in a positive direction, and then gradually decreased back to 0 V. That is, the voltage applied to the memory cell 30 may sweep from 0 V to a predetermined positive voltage, and then sweep down to 0 V from the predetermined positive voltage. In the negative voltage sweep method, an absolute value of the voltage applied to the memory cell 30 may be gradually increased from 0 V in a negative direction, and then gradually decreased back to 0 V. That is, the voltage applied to the memory cell may sweep from 0 V down to a predetermined negative voltage, and then sweep up to 0 V from the predetermined negative voltage.

FIG. 6 illustrates the current-voltage characteristic curve of the memory cell 30, which may be obtained by the current sweep method. The memory cell 30 may have a bipolar switching characteristic, and the current-voltage characteristic curve may be obtained by applying the positive current sweep method or the negative current sweep method.

In the current-voltage characteristic curve of FIG. 6, dashed curves (a) and (c) illustrate current-voltage behavior characteristics of the memory cell 30 when the variable resistance element 32 is in a low resistive state. On the other hand, solid curves (b) and (d) illustrate current-voltage behavior characteristics of the memory cell 30 when the variable resistance element 32 is in a high resistive state.

Referring to FIG. 6, a voltage response of the memory cell 30 during a positive current sweep may be monitored. A current may be externally applied to the memory cell 30 from 0 A, and may be gradually increased in the positive direction. Curve (a) represents an increasing voltage that is measured during the positive current sweep when the memory cell 30 is initially in a low resistive state.

When the externally applied current reaches a threshold current $I_{th}$, the switching element 31 in the memory cell 30 may be turned on. Because the switching element 31 is in series with the variable resistance element 32, the resistance of the switching element 31, as well as the resistance of the circuit including the switching element 31 and the variable resistance element 32, is decreased when the switching element 31 is turned on. By observing the voltage at which the resistance change occurs, a first threshold voltage $V_{th1}$ of the switching element 31 can be determined, the first threshold voltage $V_{th1}$ corresponding to a voltage at which the switching element 31 is turned on.

When the externally applied current reaches the threshold current $I_{th}$, the voltage measured in the memory cell 30 may become lower than the first threshold voltage $V_{th1}$ due to the lowered resistance of the switching element 31. When the switching element 31 is turned on and the externally applied current is subsequently increased again, the measured voltage may exhibit a tendency to increase again along the curve (a).

In an embodiment, the voltage measured in the memory cell 30 after the switching element 31 is turned on may be substantially the same as a voltage measured in the variable resistance element 32. Accordingly, when the externally applied current reaches the threshold current $I_{th}$, the voltage measured in the memory cell 30 becomes lower than the threshold voltage $V_{th1}$ due to a change in resistance of the switching element 31. The sudden change in the measured voltage after the externally applied current reaches the threshold current $I_{th}$ is referred to as a "snap-back" phenomenon.

After the switching element 31 is turned on and thus the resistance in the memory cell 30 decreases, a ratio of a variation of the measured voltage with respect to a variation of the externally applied current may be relatively reduced. Meanwhile, in the drawings, the maximum value of the current applied to the memory cell 30 from an outside source is defined and represented as a limit current $I_{2b}$.

When the variable resistance element 32 is in the low resistive state and the externally applied current is decreased back to 0 A, the voltage measured from the memory cell 30 may decrease along the curve (a).

If the memory cell 30 is initially in a high resistive state and the current applied to the memory cell 30 is gradually increased from 0 A in a positive direction, the measured voltage may increase along the curve (b). When the externally applied current reaches the threshold current $I_{th}$, the switching element 31 in the memory cell 30 may be turned on. As described above, a second threshold voltage $V_{th2}$ of the switching element 31 can be determined by observing the voltage of the switching element 31 at which the resistance change occurs. The second threshold voltage $V_{th2}$ can be observed along the curve (b).

After the externally applied current reaches the threshold current $I_{th}$, the real voltage measured from the memory cell 30 may become lower than the second threshold voltage $V_{th2}$ due to the lowered resistance of the switching element 31. When the externally applied current is subsequently increased again, the measured voltage may exhibit a tendency to increase again along the curve (b). In an embodiment, after the switching element 31 is turned on, the voltage measured in the memory cell 30 may be substantially the same as a voltage measured in the variable resistance element 32.

After the switching element 31 is turned on, the externally applied current may be continuously increased to reach a set current $I_{set}$. If the externally applied current reaches the set current $I_{set}$, a set operation, in which a resistive state of the variable resistance element 32 changes from the high resistive state into the low resistive state, may occur. When the resistance of the memory cell 30 is decreased again, the voltage measured from the memory cell 30 may decrease from a set voltage $V_{set}$ corresponding to a value of the set current $I_{set}$ on the curve (b) to a voltage corresponding to a value of the set current $I_{set}$ on the curve (a). Next, if the externally applied current is increased again, the voltage measured from the memory cell 30 may increase again along the curve (a).

In addition, after the variable resistance element 32 changes into the low resistive state along the curve (a), if the externally applied current is decreased again to 0 A, the voltage measured from the memory cell 30 may decrease along the curve (a).

Referring back to FIG. 6, the current that is externally applied to the memory cell 30 may be decreased from 0 V to a predetermined negative current. Curve (c) represents a measured voltage when the memory cell 30 is in the low resistive state, initially. When the externally applied current reaches a threshold current $I_{thn}$, the switching element 31 of the memory cell 30 may be turned on, and a third threshold voltage $V_{th3}$ may be measured in the memory cell 30. After the switching element 31 is turned on and the externally applied current is equal to the threshold current $I_{thn}$, an absolute value of the voltage measured in the memory cell 30 may become smaller than the absolute value of the third threshold voltage $V_{th3}$ due to the lowered resistance of the switching element 31.

Subsequently, if the current is lowered to a predetermined reset current $I_{reset}$, a reset operation, in which the resistive state of the variable resistance element 32 changes from the low resistive state into the high resistive state, may occur. After the applied current is lowered to the predetermined reset current $I_{reset}$, the resistance of the variable resistance element 32 may increase relatively rapidly. The reset operation finishes at a reset voltage $V_{reset}$ along the curve (c). Accordingly, after the reset operation is finished, the measured voltage according to the externally applied current may vary along the curve (d).

In addition, after the variable resistance element 32 changes into the high resistive state, if the externally applied current is increased back to 0 A, the absolute value of the measured voltage of the memory cell 30 may decrease along the curve (d).

As described above, referring to the current-voltage characteristic curve of FIG. 6, the set operation of the variable resistance element 32 of the memory cell 30 may be performed at a positive voltage, and the reset operation of the variable resistance element 32 may be performed at a negative voltage.

Referring to FIGS. 5 and 6, in operation S130, a first read voltage and a second read voltage may be determined in a threshold-sensing range $V_{rd1}$ and a resistance-sensing range $V_{rd2}$ of the current-voltage characteristic curve, respectively. Referring to FIG. 6, the threshold-sensing range $V_{rd1}$ may be a voltage range between the turn-on voltage $V_{th1}$ of the switching element 31 when the variable resistance element 32 is in the low resistive state and the turn-on voltage $V_{th2}$ of the switching element 31 when the variable resistance element 32 is in the high resistive state. The resistance-sensing range $V_{rd2}$ may be a voltage range between the turn-on voltage $V_{th2}$ of the switching element 31 when the variable resistance element 32 is in the high resistive state and the set voltage $V_{set}$ of the variable resistance element 32.

FIG. 6, for example, illustrates a first read voltage $V_1$ in the threshold-sensing range $V_{rd1}$ and a second read voltage $V_2$ in the resistance-sensing range $V_{rd2}$.

In operation S140 of FIG. 5, at least one of a first read operation, wherein the first read voltage $V_1$ is applied to the memory cell 30, and a second read operation, wherein the second read voltage $V_2$ is applied to the memory cell 30, may be performed. The first read operation or the second read operation may be performed by applying the first read voltage $V_1$ or the second read voltage $V_2$ to the memory cell 30 by the sense amplifier 2000 of FIG. 1, respectively.

In operation S150 of FIG. 5, a data value of the memory cell 30 may be determined on the basis of at least one result of the first and second read operations.

In an embodiment, the first read operation and the second read operation may be performed in sequence. In the first read operation, the sense amplifier 2000 obtains a first cell current measured from the selected memory cell 30 in response to the first read voltage $V_1$, and compares the first cell current with a first reference current. If the first cell current is greater than the first reference current, the data value stored in the memory cell 30 may be determined to be a data signal having a first logic value, e.g., a high data signal High. In contrast, if the first cell current is less than the first reference current, the data value stored in the memory cell 30 may be determined to be a data signal having a second logic value, e.g., a low data signal Low.

In some other embodiments, if the first cell current is greater than the first reference current, the data value stored in the memory cell 30 may be determined to be the low data signal Low, and if the first cell current is less than the first reference current, the data value stored in the memory cell 30 may be determined to be the high data signal High.

Subsequently, in the second read operation, the sense amplifier 2000 obtains a second cell current measured from the selected memory cell 30 in response to the second read voltage $V_2$, and compares the second cell current with a second reference current. If the second cell current is greater than the second reference current, the data value stored in the memory cell 30 may be determined to be the high data signal High. In contrast, if the second cell current is less than the second reference current, the data value stored in the memory cell 30 may be determined to be the low data signal Low.

In some other embodiments, if the second cell current is greater than the second reference current, the data value stored in the memory cell 30 may be determined to be the low data signal Low, and if the second cell current is less than the second reference current, the data value stored in the memory cell 30 may be determined to be the high data signal High. Meanwhile, in some embodiments, the first reference current of the first read operation and the second reference current of the second read operation may be substantially identical.

Subsequently, in the first and second read operations, if at least one of the first cell current and the second cell current, which are measured by respectively applying the first read voltage $V_1$ and the second read voltage $V_2$ to the memory cell 30, is determined to be greater than its corresponding reference current, the sense amplifier 2000 may output the high data signal High as the data value stored in the memory cell 30.

On the other hand, in the first and second read operations, if both of the first cell current and the second cell current, which are measured by respectively applying the first read voltage $V_1$ and the second read voltage $V_2$ to the memory cell 30, are determined to be less than the first and second reference currents, respectively, the sense amplifier 2000 may output the low data signal Low as the data value stored in the memory cell 30.

More specifically, in an embodiment referring to FIG. 6, in the first read operation, if the variable resistance element 32 is in the high resistive state when the first read voltage $V_1$ is applied to the memory cell 30, a first current $I_{1a}$ is measured as the first cell current, and if the variable resistance element 32 is in the low resistive state, a second current $I_{1b}$ is measured as the first cell current. When a first reference current having a current value between the first current $I_{1a}$ and the second current $I_{1b}$ is inputted to the sense amplifier 2000, the sense amplifier 2000 may compare the first cell current and the first reference current and determine the data value stored in the memory cell 30 based on the comparison.

Similarly, in the second read operation, if the variable resistance element 32 is in the high resistive state when the second is read voltage $V_2$ is applied to the memory cell 30, a first current $I_{2a}$ is measured as the second cell current, and if the variable resistance element 32 is in the low resistive state, a second current $I_{2b}$ is measured as the second cell current. When a second reference current having a current value between the first current $I_{2a}$ and the second current $I_{2b}$ is inputted to the sense amplifier 2000, the sense amplifier 2000 may compare the second cell current and the second reference current and determine the data value stored in the memory cell 30 based on the comparison.

As described above, a data value stored in the resistance change memory device can be determined by comparing a current measured in the memory cell 30 to first and second reference currents, according to an embodiment. In some embodiments, the first reference current and the second reference current may be substantially identical.

In some other embodiments, operations S140 and S150 of FIG. 5 may be performed as follows. At first, the first read operation may be performed. If the first cell current measured in the first read operation is greater than the first reference current, the high data signal High is outputted as the data value stored in the memory cell 30 and the read operation may be finished. However, if the first cell current is instead less than the first reference current in the first read operation, the second read operation may be performed after the first read operation in sequence. If the second cell current measured in the second read operation is greater than the second reference current, the high data signal High may be outputted as the data value stored in the memory cell 30 and the read operation may be finished. On the other hand, if the second cell current measured in the second read operation is less than the second reference current, the low data signal Low may be outputted as the data value stored in the memory cell 30, and the read operation may be finished.

As described above, if the data value stored in the memory cell 30 is determined as the low data signal Low in the first read operation, the second read operation may be additionally performed. Accordingly, an error caused by incorrectly determining a high data signal High as a low data signal Low can be reduced. That is, the data value stored in the memory cell 30 may be more accurately determined by performing the second read operation when the measured cell current is lower than the first reference current.

In some other embodiments, the current-voltage characteristic curve according to the current sweep method may have a variety of forms according to physical properties of material layers constituting the switching element 31 and the variable resistance element 32. Hereinafter, methods of sensing characteristics of memory cells in resistance change memory devices, which may have different current-voltage characteristic curves, will be described with reference to FIGS. 7A, 7B, 8A, and 8B.

Figure 7A:
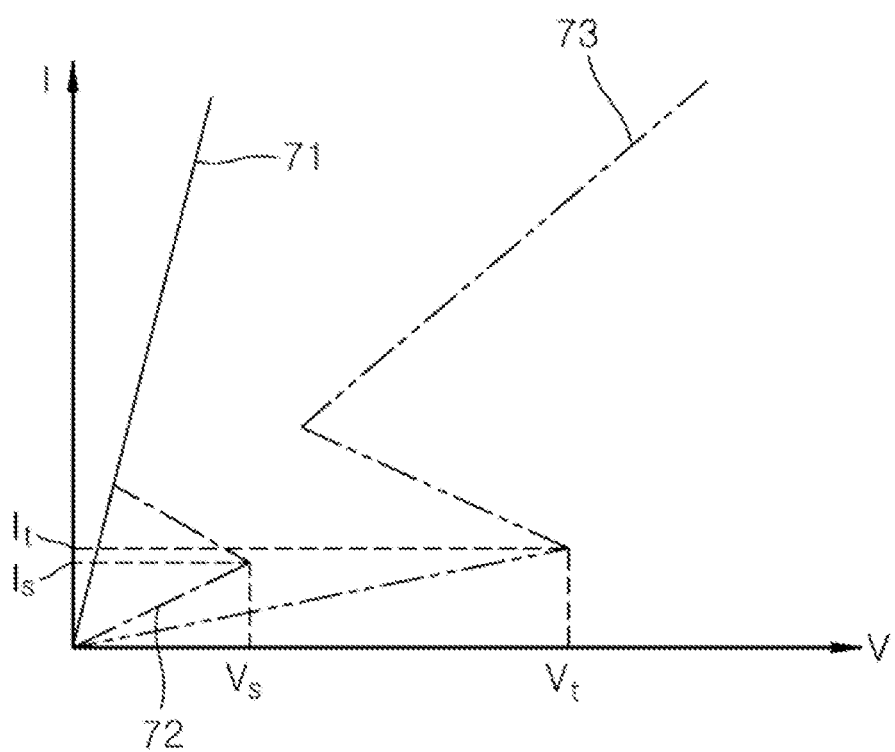
FIGS. 7A and 7B illustrate current-voltage characteristic curves of a memory cell in a resistance change memory device according to another embodiment of the present disclosure.
Figure 7B:
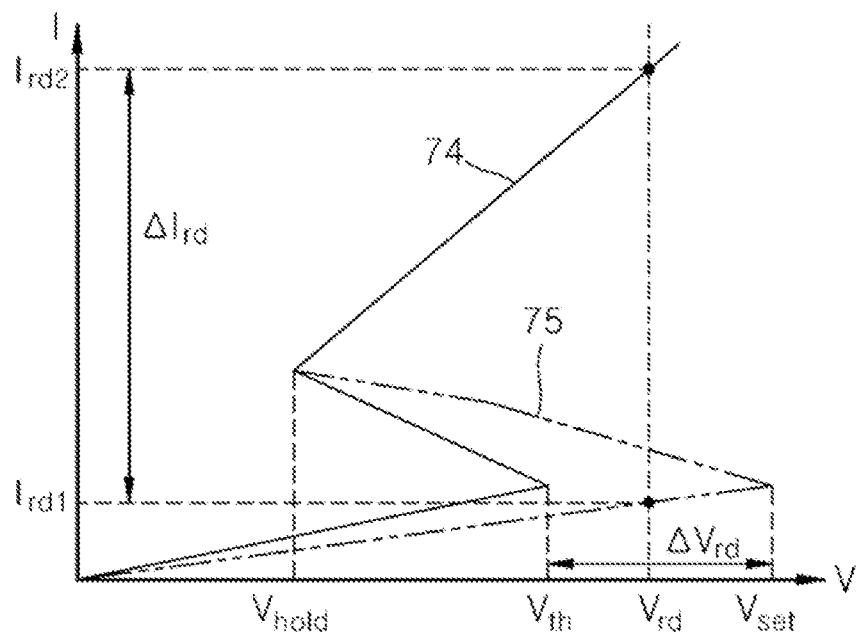

FIGS. 7A and 7B illustrate current-voltage characteristic curves of a memory cell in a resistance change memory device according to an embodiment of the present disclosure. The illustrated current-voltage characteristic curves may be obtained by a current sweep method.

A memory cell that produces the illustrated current-voltage characteristic curves may include a variable resistance element and a switching element that are connected to each other in series. A first curve 71 and a second curve 72 in FIG. 7A are current-voltage characteristic curves of the variable resistance element obtained independently of the switching element, and are obtained by a current sweep method. A third curve 73 in FIG. 7A is a current-voltage characteristic curve of the switching element obtained independently of the variable resistance element, and is obtained by the current sweep method. A fourth curve 74 and a fifth curve 75 in FIG. 7B are current-voltage characteristic curves for the memory cell, in which the variable resistance element and the switching element are coupled.

Referring to FIG. 7A, an external current may be applied to the variable resistance element and may be gradually increased from 0 A in a positive direction using the current sweep method. If the variable resistance element is in a low resistive state initially, a voltage measured across the variable resistance element may increase from 0 V along the first curve 71. On the other hand, if the variable resistance element is in a high resistive state initially, a voltage measured across the variable resistance element may increase from 0 V along the second curve 72. When the externally applied current reaches a set current $I_s$, a set operation, in which the resistive state of the variable resistance element changes from the high resistive state to the low resistive state, may occur in the variable resistance element. Accordingly, the set operation may decrease the resistance of the variable resistance element. Due to the lowered resistance of the variable resistance element, the measured voltage may decrease from a set voltage $V_s$ corresponding to the set current $I_s$ on the second curve 72 to a voltage corresponding to a predetermined current on the first curve 71.

Referring to FIG. 7A, an external current may be applied to the switching element and may be gradually increased from 0 A in a positive direction using the current sweep method. A voltage measured across the switching element may increase from 0 V along the third curve 73. When the externally applied current reaches a threshold current $I_t$, the voltage measured across the switching element may decrease from a threshold voltage $V_t$ due to the above-described snap-back phenomenon. When the externally applied current is subsequently increased again, the measured voltage may exhibit a tendency to increase again along the third curve 73.

In an embodiment, as illustrated in FIG. 7A, a current level of the threshold current $I_t$ of the switching element and a current level of the set current $I_s$ of the variable resistance element are substantially identical or close to each other, and the resistance of the switching element after being turned on is greater than the resistance of the variable resistance element having the low resistive state. Therefore, the current-voltage characteristic curve of FIG. 7B, which corresponds to a voltage measured across the switching element and the variable resistance element that are coupled together, may be obtained by combining the curves 71, 72, and 73 in FIG. 7A.

Referring to FIG. 7B, when the variable resistance element is in the low resistive state and the externally applied current is increased from 0 A in a positive direction, a voltage measured across the memory cell may increase from 0 V along the fourth curve 74. When the externally applied current reaches a threshold current and thus the switching element is turned on, the measured voltage may decrease to a hold voltage $V_{hold}$ due to the snap-back phenomenon. When the externally applied current is subsequently increased again, the measured voltage may increase from the hold voltage $V_{hold}$ along the fourth curve 74.

Meanwhile, when the variable resistance element is in the high resistive state and the externally applied current is increased from 0 A in a positive direction, a voltage measured across the memory cell may increase from 0 V along the fifth curve 75. When the externally applied current reaches a threshold current, the switching element may be turned on. In this embodiment, a turn-on voltage of the switching element and a set voltage $V_{set}$ of the variable resistance element may be identical. This is because, as illustrated in FIG. 7A, a level of a turn-on current of the switching element and a level of the set current of the variable resistance element are substantially identical or very close to each other. Accordingly, a set operation of the variable resistance element may occur at the same time as the turn-on operation of the switching element when the variable resistance element is in the high resistive state.

If the set operation occurs in the variable resistance element, the measured voltage of the memory cell may decrease from the set voltage $V_{set}$ of the fifth curve 75 to the hold voltage $V_{hold}$ of the fourth curve 74. Subsequently, if the externally applied current is increased again, the voltage measured in the memory cell may increase along the fourth curve 74.

As described above, when the current-voltage characteristic curve of the memory cell follows the curves illustrated in FIG. 7B, and a read operation for the memory cell is performed in a resistance-sensing range, the reliability of the read operation may be degraded. This is because the turn-on voltage of the switching element, when the variable resistance element is in the high resistive state, and the set voltage $V_{set}$ of the variable resistance element are substantially identical as shown in FIG. 7B, and the resistance-sensing range is limited to the set voltage $V_{set}$. In this case, the is read operation for the memory cell may be effectively performed in a threshold-sensing range. In other words, a read voltage $V_{rd}$ may be between the turn-on voltage $V_{th}$ of the switching element when the variable resistance element is in the low resistive state and the turn-on voltage $V_{set}$ of the switching element when the variable resistance element is in the high resistive state.

Referring to FIG. 7B, when the read voltage $V_{rd}$ is applied to the memory cell, if the variable resistance element is in the high resistive state, a measured cell current is a first current $I_{rd1}$; and if the variable resistance element is in the low resistive state, the measured cell current is a second current $I_{rd2}$. As illustrated, the low resistive state and the high resistive state may generate a cell current difference $\Delta I_{rd}$ that is a difference between $I_{rd1}$ and $I_{rd2}$. If a reference current having a value between the first current $I_{rd1}$ and the second current $I_{rd2}$ is inputted to the sense amplifier 2000, the sense amplifier 2000 may compare the first current $I_{rd1}$ or the second current $I_{rd2}$ with the reference current, and determine a data value stored in the memory cell based on the comparison.

Meanwhile, in the method of sensing the resistance change memory device according to an embodiment, read operations for a selected memory cell may be performed in the threshold-sensing range and in the resistance-sensing range at the same time, or may be performed in sequence. Accordingly, as described with reference to FIG. 7B, even if a read voltage margin in the resistance-sensing range is insufficient, the data value in the memory cell may be reliably read out through the read operation performed in the threshold-sensing range.

Figure 8A:
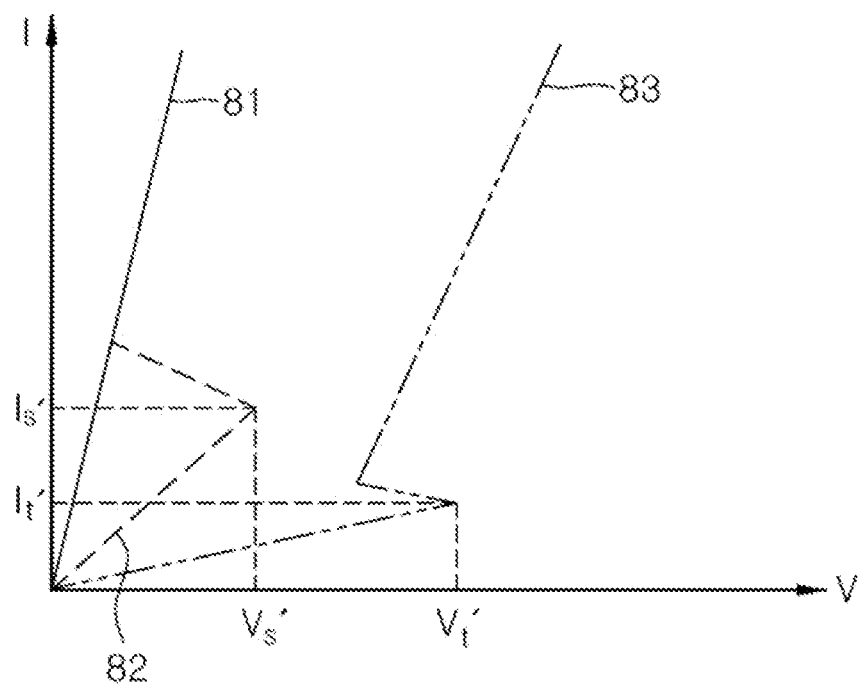
FIGS. 8A and 8B illustrate current-voltage characteristic curves of a memory cell in a resistance change memory device according to still another embodiment of the present disclosure.
Figure 8B:
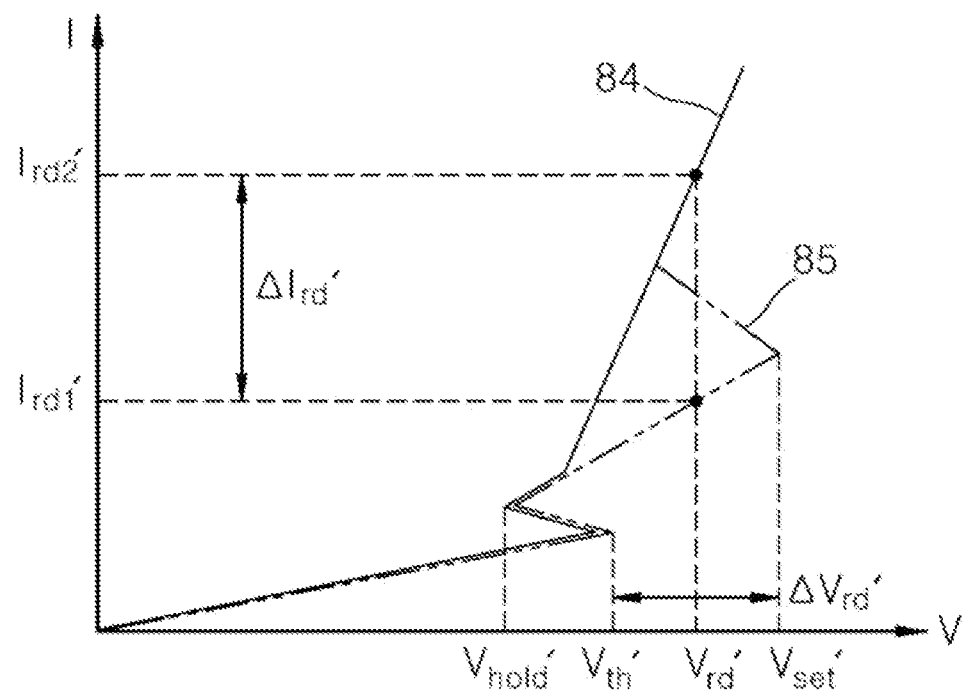

FIGS. 8A and 8B illustrate current-voltage characteristic curves of a memory cell in a resistance change memory device according to another embodiment of the present disclosure, which may be obtained by a current sweep method.

A memory cell may include a variable resistance element and a switching element that are connected in series. A first curve 81 and a second curve 82 of FIG. 8A are current-voltage characteristic curves of the variable resistance element obtained independently of the switching element, which are obtained by a current sweep method. A third curve 83 of FIG. 8A is a current-voltage characteristic curve of the switching element obtained independently of the variable resistance element, which is obtained by the current sweep method. A fourth curve 84 and a fifth curve 85 of FIG. 8B are current-voltage characteristic curves for the memory cell, in which the variable resistance element and the switching element are coupled.

Referring to FIG. 8A, an external current may be applied to the variable resistance element and may be gradually increased from 0 A in a positive direction using the current sweep method. If the variable resistance element is in a low resistive state initially, a voltage measured across the variable resistance element may increase from 0 V along the first curve 81. On the other hand, if the variable resistance element is in a high resistive state initially, the measured voltage may increase from 0 V along the second curve 82.

When the externally applied current reaches a set current $I_s$, a set operation, in which the resistive state of the variable resistance element changes from the high resistive state into the low resistive state, may occur in the variable resistance element. Accordingly, the resistance in the variable resistance element may be decreased. Due to the lowered resistance of the variable resistance element, the measured voltage may decrease from a set voltage $V_s$, corresponding to the set current $I_s$, on the second curve 82 to a voltage corresponding to a predetermined current on the first curve 81. After the set operation is finished, as the externally applied current is increased again, the measured voltage may increase along the first curve 81.

Referring to FIG. 8A, an external current may be applied to the switching element and may be gradually increased from 0 A in a positive direction using the current sweep method. A voltage measured across the switching element may increase from 0 V along the third curve 83. When the externally applied current reaches a threshold current $I_t$, the voltage measured across the switching element may become lower than a threshold voltage $V_t$, due to the above-described snap-back phenomenon. When the externally applied current is subsequently increased again, the measured voltage may exhibit a tendency to increase again along the third curve 83.

Referring to FIG. 8A, a current level difference between the threshold current $I_t$, of the switching element and the set current $I_s$, of the variable resistance element may be larger than the current level difference illustrated in FIG. 7A. The resistance of the switching element after being turned on and the resistance of the variable resistance element having the low resistive state may be substantially identical, or have similar values to the resistances illustrated in FIG. 7A. As a result, the current-voltage characteristic curve of FIG. 8B, which corresponds to a voltage measured across the switching element and the variable resistance element that are coupled together, may be obtained by combining the curves 81, 82, and 83 in FIG. 8A.

Referring to FIG. 8B, when the variable resistance element is in the low resistive state and the externally applied current is increased from 0 A in a positive direction, a voltage increasing from 0 V along the fourth curve 84 may be measured. When the externally applied current reaches a threshold current, the switching element is turned on at a threshold voltage $V_{th'}$, and the measured voltage may decrease to a hold voltage $V_{hold'}$ due to the snap-back phenomenon. Then, when the externally applied current is increased again, the measured voltage may increase from the hold voltage $V_{hold'}$ along the fourth curve 84.

Meanwhile, when the variable resistance element is in the high resistive state and the externally applied current is increased from 0 A in a positive direction, a measured voltage across the memory cell may increase along the fifth curve 85. When the externally applied current reaches a threshold current, the switching element may be turned on. In this embodiment, a threshold voltage of the variable resistance element in the high resistive state and the threshold voltage of the variable resistance element in the low resistive state may be substantially identical to $V_{th'}$.

After the measured voltage decreases to the hold voltage $V_{hold'}$ by the snap-back phenomenon of the variable resistance element, the measured voltage may increase from the hold voltage $V_{hold'}$ along the fifth line 85. When the externally applied current reaches a set current, a set operation may occur in the variable resistance element. If the set operation occurs in the variable resistance element, the measured voltage of the memory cell may decrease from the set voltage $V_{set'}$ of the fifth curve 85 to a voltage corresponding to a predetermined voltage of the fourth curve 84. When the externally applied current is subsequently increased again, the voltage measured in the memory cell may increase along the fourth curve 84.

As described above, when the current-voltage characteristic curve of the memory cell follows the current-voltage characteristic curve illustrated in FIG. 8B, and a read operation for the memory cell is performed in a threshold-sensing range, the reliability of the read operation may be degraded. This is because the turn-on voltage $V_{th'}$ of the switching element when the variable resistance element is in the low resistive state and the turn-on voltage $V_{th'}$ of the switching element when the variable resistance element is in the high resistive state are substantially identical as shown in FIG. 8B, and the threshold-sensing range is substantially limited to the turn-on voltage $V_{th'}$. In this case, the read operation for the memory cell may be effectively performed in a resistance-sensing range. In other words, the read voltage $V_{rd'}$ may be between the turn-on voltage $V_{th'}$ of the switching element when the variable resistance element is in the high resistive state and the set voltage $V_{set'}$ of the variable resistance element.

Referring to FIG. 8B, when the read voltage $V_{rd'}$ is applied to the memory cell, and the variable resistance element is in the high resistive state, a measured cell current may be a first current $I_{rd1'}$, and if the variable resistance element is in the low resistive state, the measured cell current may be a second current $I_{rd2'}$. As illustrated, the low resistive state and the high resistive state may generate a cell current difference of $\Delta I_{rd'}$ corresponding to a difference between the first current $I_{rd1'}$ and the second current $I_{rd2'}$. If a reference current between the first current $I_{rd1'}$ and the second current $I_{rd2'}$ is inputted to the sense amplifier 2000, the sense amplifier 2000 may compare the first current $I_{rd1'}$ or the second current $I_{rd2'}$ with the reference current, and determine a data value stored in the memory cell based on the comparison.

Meanwhile, in the method of sensing the resistance change memory device according to an embodiment, the read operation for a selected memory cell may be performed in the threshold-sensing range and in the resistance-sensing range at the same time, or may be performed in sequence. Accordingly, as described with reference to FIG. 8B, even if a read voltage margin in the threshold-sensing range is insufficient, the data value of the memory cell may be reliably read out through the read operation performed in the resistance-sensing range.

Meanwhile, apart from the above-described embodiments, when performing a read operation by applying a predetermined read voltage to a memory cell 30, a variety of factors may cause errors in the read operation. For example, different memory cells 30 of the memory cell array 1000 may each have a different size and form of the snap-back of the respective switching element 31. In another example, different memory cells 30 of the memory cell array 1000 may have different distributions of the threshold current $I_{th}$ and threshold voltages $V_{t1}$ and $V_{t2}$. In addition, the above-described electrical characteristic distributions of the switching element 31 and variable resistance element 32 may vary for each cycle of the read operation performed on the same memory cell 30. In addition, the threshold-sensing range $V_{rd1}$ or the resistance-sensing range $V_{rd2}$ of each memory cell may change over time due to the variations in the electrical characteristic distributions of each memory cell 30 in the cell array 1000.

As a result, due to any of the above-described various factors, the reliability of the read operation for the memory cell 30 may be degraded. For example, when the read operation of the memory cell 30 is performed by a single read voltage in the threshold-sensing range $V_{rd1}$ or the resistance-sensing range $V_{rd2}$, and the read voltage is outside of the threshold-sensing range $V_{rd1}$ or the resistance-sensing range $V_{rd2}$, the read operation error may occur. For example, when the threshold-sensing range $V_{rd1}$ of a specific memory cell 30 in a specific read cycle is unknown and/or inconsistent, the read operation may be performed at a read voltage outside of the threshold-sensing range $V_{rd1}$ for the specific memory cell 30. If the sense amplifier 2000 compares a cell current measured when the voltage is outside of the threshold-sensing range $V_{rd1}$ with a predetermined reference current, the sense amplifier 2000 may output an incorrect data signal.

In another example, when the resistance-sensing range $V_{rd2}$ of a specific memory cell 30 in a specific read cycle is unknown and/or inconsistent, the read operation may be performed at a voltage that is outside of the resistance-sensing range $V_{rd2}$ of the specific memory cell 30. Accordingly, the sense amplifier 2000 may output an incorrect data signal as described above.

In the meantime, the structural unreliability of the sense amplifier 2000 may also contribute to read operation errors. For example, voltage variations in the sense amplifier 2000 may cause read operation errors.

In the embodiments of the present disclosure described above, a current-voltage characteristic curve for the memory cell 30 is obtained, and then a first read voltage and a second read voltage are selected at a threshold-sensing range $V_{rd1}$ and a resistance-sensing range $V_{rd2}$ of the memory cell 30, respectively, based on the current-voltage characteristic curve. The first read voltage and the second read voltage are sequentially applied to the memory cell 30 in order to measure a first cell current and a second cell current. The measured first cell current and second cell current are compared to first and second reference currents, respectively. As a result of the comparison, if at least one of the cell currents is greater than the corresponding reference current, a high data signal may be outputted as the cell data stored in the memory cell 30. If both of the cell currents are less than the corresponding reference currents, a low data signal may be outputted as the cell data stored in the memory cell 30.

According to the embodiments disclosed in the present disclosure, the read operation is performed twice in the same memory cell. The read operation is performed in the threshold-sensing range $V_{rd1}$ and in the resistance-sensing range $V_{rd2}$, respectively. Accordingly, a read operation error due to error parameters of the memory cell 30 can be suppressed. The error parameters may include any of an inconsistent snap-back size and/or form as compared to other memory cells in the same cell array 1000, an inconsistent threshold current and/or threshold voltage distribution of the switching element 31, a different resistance distribution than other memory cells in the cell array 1000, and a different distribution of a set current or a set voltage of the variable resistance element 32.

Embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A method of sensing a resistance change memory device, the method comprising:
preparing a memory cell including a variable resistance element and a switching element, the variable resistance element being configured to store different data on the basis of a variable resistance, the switching element being connected to the variable resistance element and being configured to perform a threshold switching operation;
measuring a first cell current by applying a first read voltage to the memory cell, the first read voltage being selected in a threshold-sensing range of a current-voltage characteristic curve of the memory cell;

measuring a second cell current by applying a second read voltage to the memory cell, the second read voltage being selected in a resistance-sensing range of the current-voltage characteristic curve; and when at least one of the first cell current and the second cell current is greater than a corresponding reference current, outputting a data signal having a first logic value as data stored in the memory cell, wherein the first read voltage is selected between a first threshold voltage and a second threshold voltage, the switching element being configured to turn on at the first threshold voltage when the variable resistance element is in a low resistive state, and being configured to turn on at the second threshold voltage when the variable resistance element is in a high resistive state, and wherein the second read voltage is selected between the second threshold voltage and a set voltage, the variable resistance element being configured to undergo a set operation at the set voltage.

2. The method of claim 1, wherein the memory cell is located at a region where a first conductive line and a second conductive line intersect, the first conductive line extending in a first direction, the second conductive line extending in a second direction that is non-parallel to the first direction, the first and second conductive lines being on different planes.

3. The method of claim 1, wherein the memory cell has a first current-voltage behavior characteristic when the variable resistance element has the high resistive state, and has a second current-voltage behavior characteristic when the variable resistance element has the low resistive state.

4. The method of claim 1, further comprising:
when the first cell current is less than a first reference current and the second cell current is less than a second reference current, outputting a data signal having a second logic value as the data stored in the memory cell.

5. A method of sensing a resistance change memory device, the method comprising:
preparing a memory cell including a variable resistance element and a switching element, the variable resistance element being configured to store different data on the basis of a variable resistance, the switching element being connected to the variable resistance element and being configured to perform a threshold switching operation;
obtaining a current-voltage characteristic curve for the memory cell;
determining a first read voltage within a first threshold-sensing range of the current-voltage characteristic curve, and a second read voltage within a resistance-sensing range of the current-voltage characteristic curve;
performing at least one of a first read operation and a second read operation, the first read operation including applying the first read voltage to the memory cell, the second read operation including applying the second read voltage to the memory cell; and
determining a data value stored in the memory cell on the basis of a result of the at least one of the first read operation and the second read operation.

6. The method of claim 5,
wherein the first read operation further comprises, after applying the first read voltage:
measuring a first cell current from the memory cell; and comparing the first cell current with a first reference current, and wherein the second read operation further comprises, after applying the second read voltage:
measuring a second cell current from the memory cell; and
comparing the second cell current with a second reference current.

7. The method of claim 6,
wherein when the first cell current is greater than the first reference current in the first read operation, a data signal having a first logic value is outputted as the data value stored in the memory cell and the first read operation is finished, and wherein when the first cell current is less than the first reference current in the first read operation, the second read operation is performed, the second read operation including:
when the second cell current is greater than the second reference current, outputting the data signal having the first logic value as the data value stored in the memory cell, and
when the second cell current is less than the second reference current, outputting a data signal having a second logic value as the data value stored in the memory cell.

8. The method of claim 5, wherein the memory cell has a first current-voltage behavior characteristic when the variable resistance element is in a high resistive state, and has a second current-voltage behavior characteristic when the variable resistance element is in a low resistive state.

9. A resistance change memory device comprising:
a memory cell comprising a variable resistance element and a switching element, the variable resistance element being configured to store different data on the basis of a variable resistance, the switching element being connected to the variable resistance element and being configured to perform a threshold switching operation; and
a sense amplifier configured to perform a read operation on the memory cell, the read operation including reading a data value stored in the variable resistance element, wherein the read operation is performed by applying a first read voltage and a second read voltage to the memory cell, the first read voltage being selected in a threshold-sensing range of the memory cell, the second read voltage being selected in a resistance-sensing range of the memory cell, wherein the threshold-sensing range is a range between a first threshold voltage and a second threshold voltage, the switching element being turned on at the first threshold voltage when the variable resistance element is in a low resistive state, the switching element being turned on at the second threshold voltage when the variable resistance element is in a high resistive state, and wherein the resistance-sensing range is a range between the second threshold voltage and a set voltage, the variable resistance element undergoing a set operation at the set voltage.

10. The resistance change memory device of claim 9,
wherein the memory cell is located at a region where a first conductive line and a second conductive line intersect, the first conductive line being arranged in a first direction, the second conductive line being arranged in a second direction that is non-parallel to the first direction, the first and second conductive lines being on different planes.

11. The resistance change memory device of claim 9, wherein the sense amplifier outputs a data signal having a first logic value as the data value stored in the memory cell when at least one of a first cell current is greater than a first reference current and a second cell current is greater than a second reference current, the first cell current and second cell current being measured by applying the first read voltage and the second read voltage to the memory cell, respectively, and wherein the sense amplifier outputs a data signal having a second logic value as the data value stored in the memory cell when the first cell current is less than the first reference current and the second cell current is less than the second reference current.

12. The resistance change memory device of claim 9, wherein the variable resistance element has a bipolar switching characteristic.

13. The resistance change memory device of claim 9, wherein the variable resistance element and the switching element are electrically connected to each other in series.

14. The resistance change memory device of claim 9, wherein the resistance change memory device comprises one of a resistive RAM device, a phase change RAM device, and a magnetic RAM device.

15. The resistance change memory device of claim 9, wherein the switching element comprises one of a transistor, a diode, a tunnel barrier element, an ovonic threshold switch, and a metal-insulator-metal switch.

* * * * *